(12) United States Patent
Okura

(10) Patent No.: US 6,172,666 B1
(45) Date of Patent: Jan. 9, 2001

(54) EQUIPMENT OPERATION PANEL

(75) Inventor: Michitaka Okura, Nagoya (JP)

(73) Assignee: Toyotomi Co., Ltd., Nagoya (JP)

( * ) Notice: Under 35 U.S.C. 154(b), the term of this patent shall be extended for 0 days.

(21) Appl. No.: 09/000,766

(22) Filed: Dec. 30, 1997

(30) Foreign Application Priority Data

Jun. 30, 1997 (JP) .................................................. 9-190567
Jul. 22, 1997 (JP) .................................................. 9-212583

(51) Int. Cl.[7] ....................................................... G09G 5/00
(52) U.S. Cl. ........................... 345/168; 708/138; 200/5 A
(58) Field of Search .................................... 361/627, 628, 361/640; 708/138, 142, 143, 190; 200/5 A

(56) References Cited

U.S. PATENT DOCUMENTS

| | | | |
|---|---|---|---|
| 4,096,577 | * | 6/1978 | Ferber et al. .......................... 708/138 |
| 4,145,584 | * | 3/1979 | Otterlei ................................. 200/5 A |
| 4,263,659 | * | 4/1981 | Hirata et al. .......................... 708/190 |

* cited by examiner

Primary Examiner—Steven J. Saras
Assistant Examiner—Alecia D. Nelson
(74) Attorney, Agent, or Firm—Pollock, Vande Sande & Amernick

(57) ABSTRACT

An equipment operation panel capable of being readily mounted on an outer surface of an equipment and facilitating connection thereof to a control unit in the equipment. A first flexible circuit board is formed on a front surface thereof with contacts of switches and a contact of a variable resistor and provided thereon with light emitting diodes. The first flexible circuit board includes a lead-out section from which a connection wire pattern is led out. A spacer layer is laminated on the circuit board. A second flexible circuit board is laminated on the spacer layer and provided thereon with contacts of switches and a movable-side electrode of the variable resistor. A cover sheet member is laminated on the second flexible circuit board. Thus, the equipment operation panel is constructed into a laminate structure and mounted on an outer surface of a casing of the equipment through an adhesive layer. The lead-out section of the first flexible circuit board extending from the laminate is inserted into the casing, resulting in being connected to the control unit.

21 Claims, 11 Drawing Sheets

EQUIPMENT OPERATION PANEL

BACKGROUND OF THE INVENTION

This invention relates to an equipment operation panel, and more particularly to an equipment operation panel which includes an operation signal generation electric component for feeding an operation signal to a control unit received in an equipment such as a room heater, an electric appliance or the like and is mounted on a casing of the equipment.

An equipment such as an oil room heater, a gas room heater or the like includes an operation section provided with electric parts or components such as a switch and a variable resistor for driving the heater, a luminous display means for displaying an operation state of the equipment, and the like. A conventional equipment operation panel for such an operation section includes a rigid circuit board which is made of bakelite, epoxy resin or the like and on which the electronic components are mounted. The circuit board is then supported on a frame made of a synthetic resin material. The frame having the circuit board supported thereon is then fixedly mounted on a casing of the equipment in such a manner that the electric components and luminous display means which are required to be externally operated are positioned in an opening of the casing. The opening of the casing is closed with a cover member having a character, a mark or the like printed on a surface thereof and including a light-permeable section which permits light emitted from the luminous display means to permeate therethrough. Also, the cover member is so formed that a portion thereof corresponding to the switch and the like which are required to be externally operated exhibits flexibility.

In the conventional equipment operation panel, as noted from the above, it is required to form the opening of the casing of the equipment into an increased size. This renders a design for the casing troublesome and causes a location on the casing at which the equipment operation panel is to be mounted to be subject to restriction. Also, the conventional equipment operation panel renders mounting of the panel on the casing of the equipment highly troublesome.

In general, a heater such as an oil room heater or the like is constructed so as to selectively adjust combustion to a desired combustion level between a minimum combustion level and a maximum one by manual operation. For such adjustment, a variable resistor of the slide type has been conventionally used. The conventional slide type variable resistor is constructed so as to mechanically slide a slider. Unfortunately, such construction of the variable resistor fails to permit a thickness of the equipment operation panel to be satisfactorily reduced. Thus, it is obliged to receive a part of the equipment operation panel in the casing.

SUMMARY OF THE INVENTION

The present invention has been made in view of the foregoing disadvantage of the prior art.

Accordingly, it is an object of the present invention to provide an equipment operation panel which is capable of being readily mounted on an outer surface of a casing of an equipment and facilitating connection thereof to a control unit arranged in the equipment.

It is another object of the present invention to provide an equipment operation panel which is capable of being significantly reduced in thickness and mounted on an outer surface of a casing of an equipment by means of an adhesive.

It is a further object of the present invention to provide an equipment operation panel which is capable of being significantly reduced in thickness while incorporating a variable resistor as an operation signal generation electric component therein.

It is still another object of the present invention to provide an equipment operation panel which is capable of being reduced in thickness while incorporating an operation signal generation electric component and a luminous element or light emitting element therein.

It is yet another object of the present invention to provide an equipment operation panel which is capable of increasing an area of a luminous display section while constructing the luminous display section of a light emitting element decreased in luminous plane.

In accordance with the present invention, an equipment operation panel which includes an operation signal generation electric component for feeding an operation signal to a control unit arranged in an equipment or both the operation signal generation electric component and a light emitting element and is fixed on a casing of the equipment is provided. The equipment operation panel includes a first flexible circuit board including a main section formed thereon with a first circuit pattern including contacts of the operation signal generation electric component and a lead-out section arranged so as to extend from the main section and formed with a plurality of connection wire patterns connected to the first circuit pattern. The main section and lead-out section are arranged on a front surface of the first flexible circuit board. The equipment operation panel also includes a spacer layer provided with windows for exposing the contacts therethrough and laminated on the front surface of the first flexible circuit board, conductive members arranged in correspondence to the windows to generate the operation signal by contact with the contacts, a second flexible circuit board laminated on the spacer layer and including a second circuit pattern which includes or is electrically connected to the conductive members, and a cover sheet member laminated on the second flexible circuit board and formed so that at least a portion thereof corresponding to the conductive members exhibits flexibility. The main section of the first flexible circuit board, the spacer layer, the second flexible circuit board and the cover sheet member are laminated on each other in turn to provide a single laminate. The lead-out section of the first flexible circuit board is led out of the laminate in a manner to be insertable into the equipment.

Such construction of the present invention permits mounting of the equipment operation panel on the equipment to be readily accomplished by merely introducing the lead-out section of the first flexible circuit board into the casing of the equipment and fixing the laminate to an outer surface of the casing of the equipment. Also, the laminate significantly reduces a thickness of the equipment operation panel.

Such mounting of the equipment operation panel on the outer surface of the casing of the equipment may be carried out in such a manner that the main section of the first flexible circuit board is bonded on a rear surface thereof directly to the outer surface of the casing by means of an adhesive. Alternatively, the first flexible circuit board may be mounted on the outer surface of the casing through any suitable insulating sheet.

The first flexible circuit board may be provided thereon with a luminous element or light emitting element for displaying an operation state of the equipment. In this instance, the spacer layer may be formed with windows for receiving the light emitting element and the second flexible circuit board may be provided at a portion thereof corresponding to the light emitting element with windows or constructed so that the portion exhibits light-permeability. Also, the cover sheet member may be constructed so that a portion thereof corresponding to the light emitting element may exhibit light-permeability.

In a preferred embodiment of the present invention, the operation signal generation electric component may be constituted by a variable resistor. In this instance, the variable resistor may be constructed of the contacts constituted by a plurality of filament electrodes arranged on the front surface of the first flexible circuit board so as to be spaced from each other at predetermined intervals, a thin or thick resistive film formed on the front surface of the first flexible circuit board to electrically connect the plural filament electrodes to each other therethrough, and the conductive members incorporated in the second circuit pattern of the second flexible circuit board and positioned opposite to the plural filament electrodes. The first circuit pattern and second circuit pattern are constructed so as to provide the operation signal proportional to a resistance value of the resistive film between at least one filament electrode positioned at one end of the resistive film and the conductive members. Such construction, when a portion of the cover sheet member corresponding to the conductive member is pushed by a finger, permits the conductive member to be contacted with a part of the plural filament electrodes of the first circuit pattern, resulting in an operation signal proportional to a resistance value of the resistive film between one end of the resistive film and the filament electrode contacted with the conductive member. This eliminates arrangement of any mechanical slider, to thereby reduce a thickness of the equipment operation panel. In order to derive an output of the second circuit pattern from the connection wire pattern at the lead-out section of the first flexible circuit board, the first and second circuit patterns may be electrically connected to each other at any position. Most simply, the panel may be constructed so that the first and second flexible circuit boards are formed by folding a single flexible circuit board material into two and the first and second circuit patterns are formed at the folding portion between both boards. Also, the lead-out section may be led out of each of both first and second flexible circuit boards.

Alternatively, the variable resistor may include the contacts constructed of a first filament electrode group including a plurality of filament electrodes arranged on the front surface of the first flexible circuit board so as to be spaced from each other at predetermined intervals and a second filament electrode group including a plurality of filament electrodes arranged in a manner to alternate with the plural filament electrodes of the first filament electrode group therebetween, to thereby be prevented from being contacted with the plural filament electrodes of the first filament electrode group and electrically connected to each other by means of a connection wire; a thin or thick resistive film formed on the front surface of the first flexible circuit board to electrically connect the plural filament electrodes of the first filament electrode group to each other therethrough; and the conductive member arranged opposite to the first and second filament electrode groups and incorporated in the second circuit pattern of the second flexible circuit board. The first circuit pattern is constructed so as to provide the operation signal proportional to a resistance value between at least one filament electrode positioned at one end of the first filament electrode group and the connection wire. The conductive member incorporated in the second circuit pattern of the second flexible circuit board may function to carry out short-circuiting between predetermined filament electrodes of the first filament electrode group and those of the second one. Such construction eliminates a necessity of generating an output of the second circuit pattern, to thereby eliminate electrical connection between the first circuit pattern and the second circuit pattern, so that the equipment operation panel may be simplified in structure.

When both a operation signal generation electric component and a light emitting element are incorporated in the equipment operation panel, the light emitting element and other parts associated therewith are often caused to be increased in thickness. This eventually leads to a deterioration in operability of the equipment operation panel and a failure in contact between the conductive member and the contact.

In accordance with the present invention, an equipment operation panel which is adapted to eliminate such a disadvantage is provided. The equipment operation panel, when the operation signal generation electric component is free of any variable resistor, may be constructed so as to include a first flexible circuit board including a main section fixedly mounted thereon with a first circuit pattern and a light emitting element electrically connected to the first circuit pattern and a lead-out section arranged so as to extend from the main section and formed with a plurality of connection wire patterns connected to the first circuit pattern, wherein the main section and lead-out section are arranged on a front surface of the first flexible circuit board and the light emitting element is fixed on the main section. Also, the panel includes a first spacer layer provided with windows for receiving the light emitting element therein and laminated on the front surface of the first flexible circuit board; a second flexible circuit board including a main section laminated on the first spacer layer, formed on a front surface thereof with a second circuit pattern including contacts of the operation signal generation electric component and formed at a portion thereof corresponding to the light emitting element with windows, and a lead-out section arranged so as to extend from the main section and formed with a plurality of connection wire patterns connected to the second circuit pattern; a second spacer layer provided with at least one window for exposing the contacts therethrough and windows corresponding to the light emitting element and laminated on the front surface of the second flexible circuit board; a conductive member arranged in correspondence to the windows of the second spacer layer to generate the operation signal by contact with the contacts; and a cover sheet member laminated on the second spacer layer and constructed so that at least a portion thereof corresponding to the conductive member exhibits flexibility. The main section of the first flexible circuit board, the first spacer layer, the main section of the second flexible circuit board, the second spacer layer and the cover sheet member are laminated on each other in turn to provide a single laminate. The lead-out section of each of the first and second flexible circuit boards is led out of the laminate in a manner to be insertable into the equipment.

When the signal generation electric component includes the variable resistor, a third flexible circuit board including a third circuit pattern which includes the conductive member or is electrically connected to the conductive member is laminated on the second spacer layer. Then, the cover sheet member is laminated on the third flexible circuit board, to thereby provide a laminate. The lead-out section of each of the first and second flexible circuit boards is led out of the laminate.

Such construction, even when a light-permeable member which is arranged above or beside the light emitting element so as to permit light emitted from the light emitting element to permeate therethrough while diffusing it is increased in thickness, eliminates a failure in contact between the conductive member and the contact.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, an equipment operation panel according to the present invention will be described hereinafter with reference to the accompanying drawings.

Figure 1:
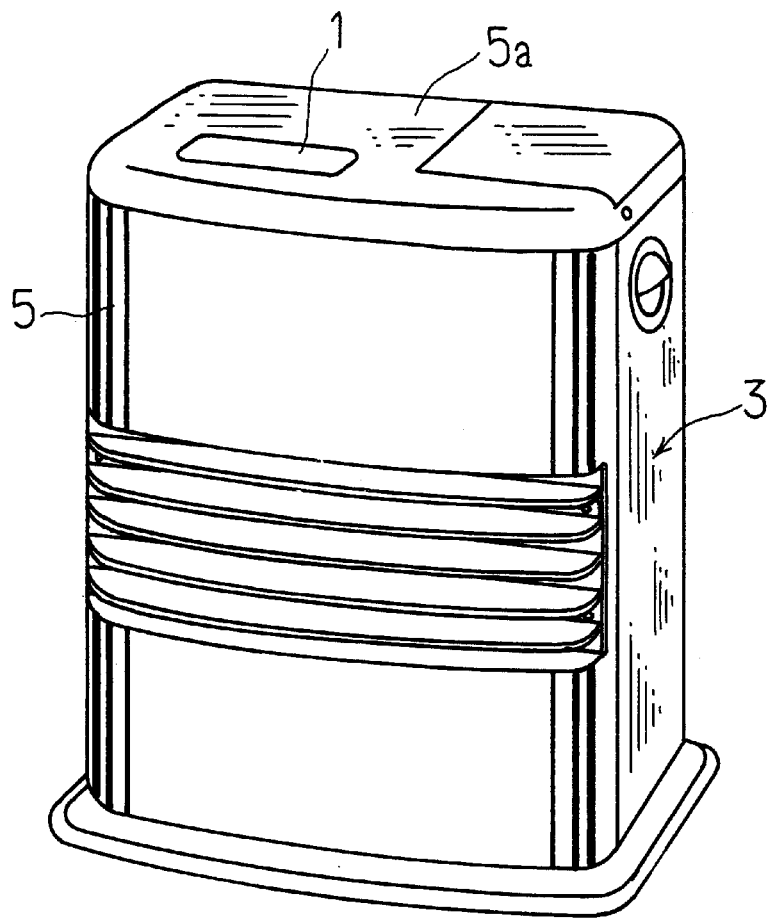
FIG. 1 is a perspective view showing an oil space heater or oil burner to which an equipment operation panel according to the present invention may be applied by way of example.

Referring first to FIG. 1, an oil space heater 3 which is in the category of an oil burner 3 and to which an equipment operation panel 1 may be applied is illustrated by way of example. The equipment operation panel 1 is mounted on a panel mounting portion of a top plate 5a of a casing of the oil space heater 3 by means of an adhesive or the like. The panel mounting portion of the top plate 5a on which the equipment operation panel 1 is mounted is somewhat recessed as compared with the remaining part thereof. The panel mounting portion of the top plate 5a is formed with a small slit (not shown) through which a lead-out section 7B is arranged so as to extend from the equipment operation panel 1 into the casing 5. Mounting of the equipment operation panel 1 on the casing 5 is carried out following insertion of the lead-out section 7B through the slit.

Figure 3:
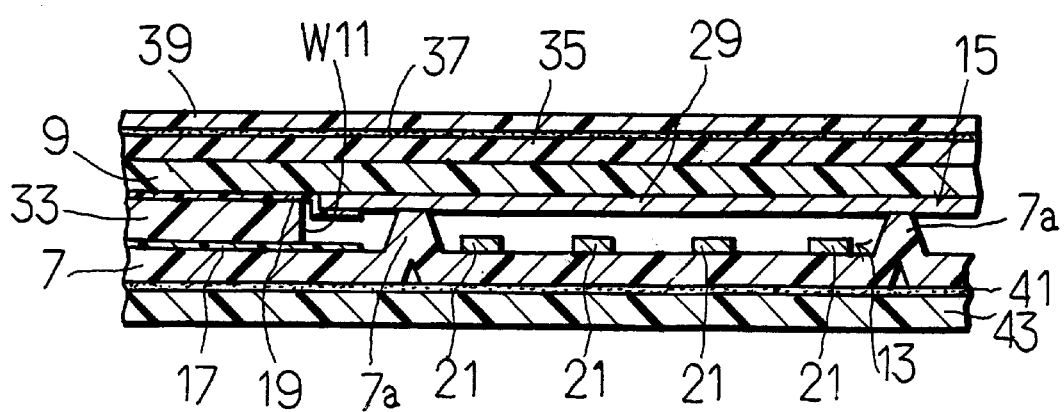
FIG. 3 is a sectional view taken along line III—III of FIG. 2.
Figure 4:
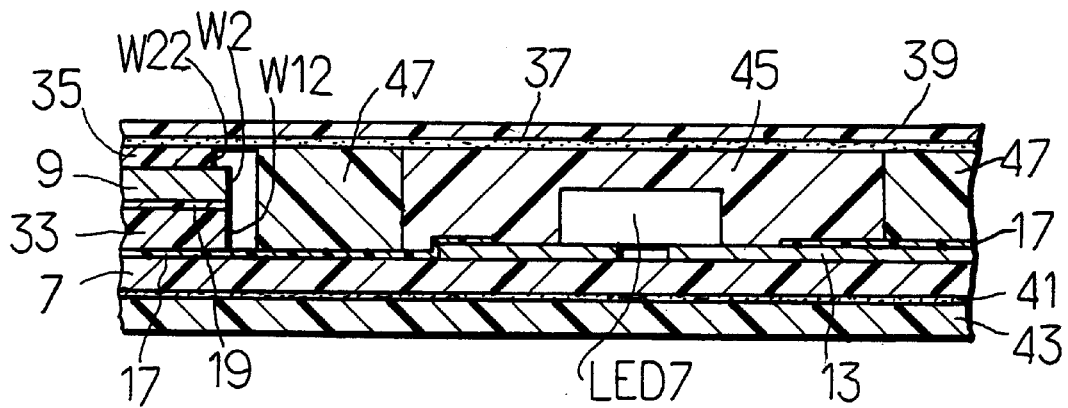
FIG. 4 is a sectional view taken along line IV—IV of FIG. 2.
Figure 5:
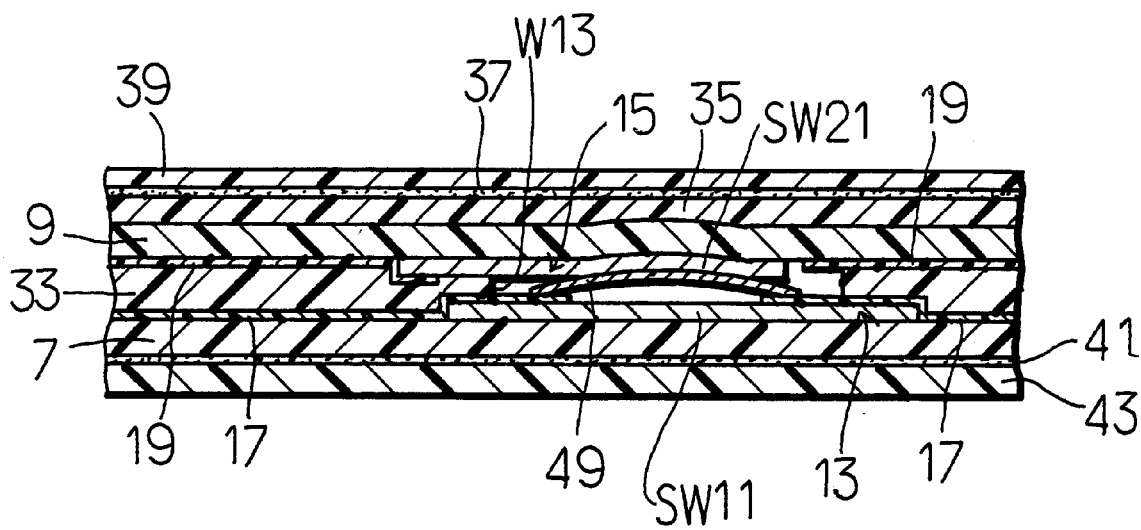
FIG. 5 is a sectional view taken along line V—V of FIG. 2.
Figure 6:
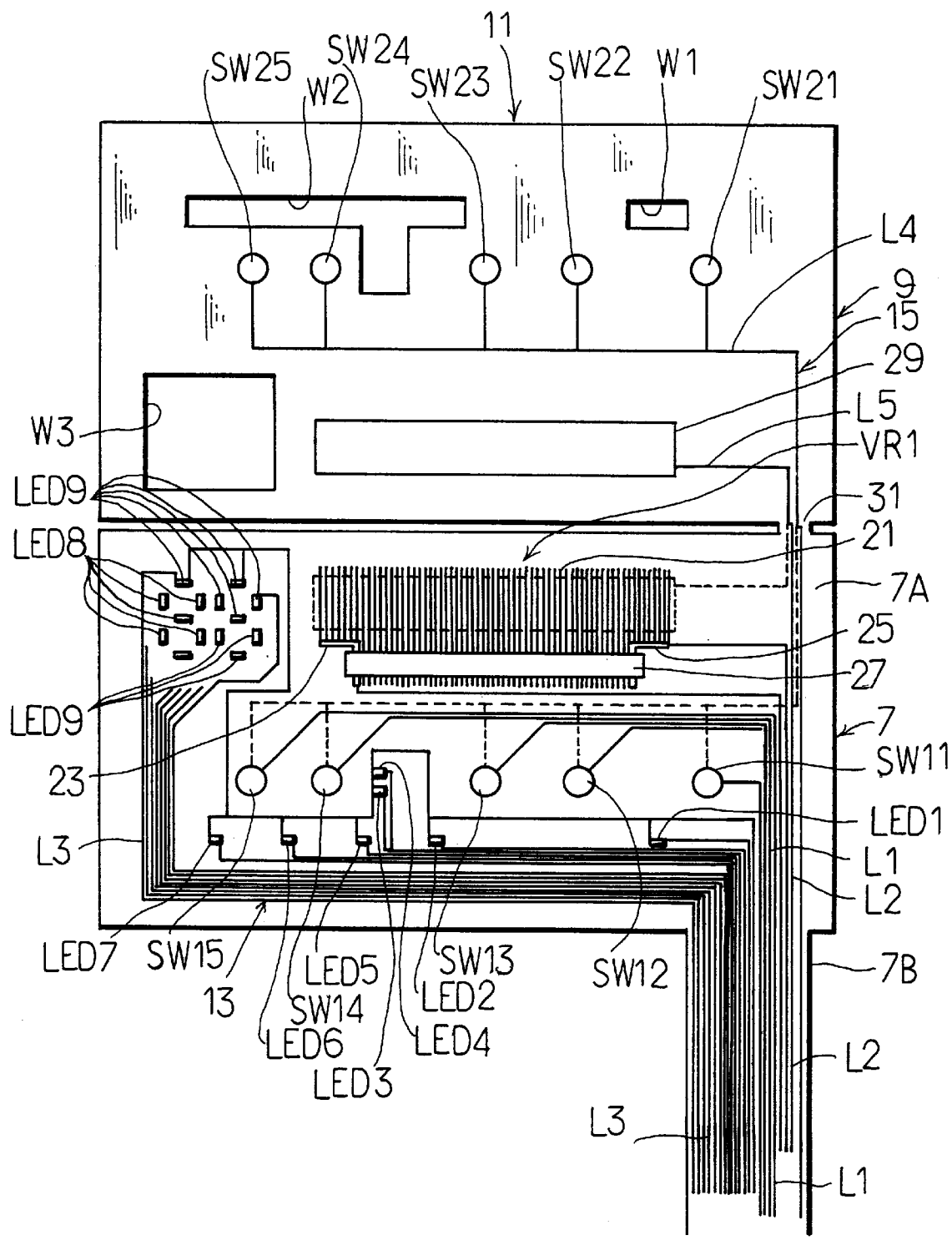
FIG. 6 is a schematic view of the equipment operation panel shown in FIG. 2 wherein a single flexible circuit substrate of an increased size is used for two flexible circuit boards.

Now, an embodiment of an equipment operation panel according to the present invention will be described with reference to FIGS. 2 to 6, wherein FIG. 6 shows a single large-sized flexible circuit substrate 11 which provides two flexible circuit boards 7 and 9 incorporated in an equipment operation panel 1 of the illustrated embodiment. The first and second flexible circuit boards 7 and 9 each include a board body made of a flexible material such as a polyester film or the like and first and second circuit patterns 13 and 15 formed of a conductive paste such as a silver paste or the like on the board body by printing. The first and second flexible circuit boards 7 and 9, as shown in FIGS. 3 to 5, are provided on a portion thereof except contact sections of the first and second circuit patterns 13 and 15 with insulating overcoat layers 17 and 19, respectively, each of which is formed of an insulating resin paste by printing.

The first circuit pattern 13, as shown in FIG. 6, is formed on a main part of the first flexible circuit board 7 and includes contacts SW11 to SW15 of five push-on switches SW1 to SW5 (FIG. 2), a contact VR1 of a variable resistor, a plurality of wirings L1 and L2 connected to the contacts, and a plurality of wirings L3 connected to a luminous element or light emitting element constituted by light emitting diodes LED1 to LED9. The first flexible circuit board 7 includes such a lead-out section 7B as briefly describe above, which is formed thereon with a plurality of connection wire patterns each consisting of an extension of each of the wirings L1 to L3 of the first circuit pattern 13. In FIG. 6, a part of the wirings L3 to a numeral indication segment consisting of seven light emitting diodes LED8 and that consisting of seven light emitting diodes LED9 is deleted for the sake of brevity. Also, a wiring on a distal end of the lead-out section 7B is likewise omitted. The lead-out section 7B is formed at a distal end thereof with a connector connection electrode (not shown) connected to a connector. The connector connection electrode at the distal end of the lead-out section 7B is guided into the casing 5 of the equipment and inserted into the connector provided on a control board of a control unit arranged in the casing 5. When the connector connection electrode is spaced at an increased distance from the control board, the connector may be arranged at an end of a relay cable arranged so as to extend from the control board, resulting in the connector connection electrode at the distal end of the lead-out section 7B being inserted into the connector.

The light emitting diodes LED1 to LED9 each comprise a chip-like light emitting diode and is mounted on each of a plurality of electrodes on the first circuit pattern 13 by means of a conductive adhesive. The light emitting diodes LED1 to LED7 each are excited for the purpose of indicating an operation mode, operation of a timer, a necessity of feeding of fuel or the like. Also, the light emitting diodes LED8 and LED9 are adapted to display numerals indicating an operation level, a temperature or the like. The light emitting diodes LED1 to LED7 each are driven by a drive signal fed from the control unit arranged in the casing 5 of the equipment 3 through the wiring L3 thereto.

The contact VR1 of the variable resistor is constructed of a plurality of filament electrodes 21 arranged on a front surface of the first flexible circuit board 7 so as to be spaced from each other at substantially equal intervals. The filament electrodes 21 are arranged in a manner to be substantially parallel with each other, to thereby provide an electrode array. A plurality of the filament electrodes 21 positioned on both ends of the electrode array are electrically connected to each other through end electrodes 23 and 25, respectively. Reference numeral 27 designates a thin or thick resistive film 27 arranged so as to bridge the remaining filament electrodes and end electrodes 23 and 25, to thereby electrically connect the electrodes to each other. When the resistive film 27 is desired to be thin, it may be formed by sputtering; whereas when it is desired to be thick, it may be formed of a resistive paste by screen printing.

The second circuit pattern 15 is formed on a rear surface of the second flexible circuit board 9 which is opposite to the above-described front surface of the first flexible circuit board 7 and includes contacts SW21 to SW25 of the push-on switch SW1 to SW5 (FIG. 2), a movable-side electrode 29 constituting a conductive member contacted with the contact VR1 of the movable resistor, and the wirings L4 and L5. The wirings L4 and L5 are connected to the wirings of the first circuit pattern 13 through a connection or folding 31 through which the first flexible circuit board 7 and second flexible circuit board 9 are connected to each other. Dotted lines on the first flexible circuit board 7 indicate a position of the second circuit pattern 15 obtained by superposing the second flexible circuit board 9 on the first flexible circuit board 7. The movable-side electrode 29 is arranged opposite to the filament electrodes 21 and the contacts SW21 to SW25 are arranged opposite to the contacts SW11 to SW15.

The second flexible circuit board 9 is formed at a portion thereof positionally corresponding to the light emitting diode LED1 with a first window W1, at a portion thereof positionally corresponding to the light emitting diodes LED2 to LED7 with a second window W2, and at a portion thereof positionally corresponding to the numeral indication segment constituted by the light emitting diodes LED8 and LED9 with a third window W3.

Between the first flexible circuit board 7 and the second flexible circuit board 9, as shown in FIGS. 3 to 5, is arranged a spacer layer 33 of a single-layer structure provided with a plurality of windows W11, W12, W13, - - - which receive therein the contacts SW21 to SW25, the contacts SW11 to SW15, the contact VR1 of the variable resistor constituted by the filament electrodes 21, the light emitting diodes LED1 to LED9, - - - , respectively. The spacer layer 33 is made of a dielectric sheet material formed by subjecting a polyester resin powder to compression while heating, resulting in it being porous and exhibiting both flexibility and elasticity. The spacer layer 33 has an adhesive or a pressure sensitive adhesive applied to each of both surfaces thereof, resulting in being formed thereon an adhesive layer (not shown) highly reduced in thickness.

In the illustrated embodiment, as shown in FIGS. 3 to 5, the second flexible circuit board 9 is laminatedly formed on a front surface thereof with a spacer sheet 35, which is formed on a rear surface thereof opposite to the front surface of the second flexible circuit board 9 with an adhesive layer highly reduced in thickness. The spacer sheet 35 is made of a flexible synthetic resin sheet material such as, for example, a polyester film or the like and formed at a portion thereof positionally corresponding to the light emitting diodes with a plurality of windows W22 as shown in FIG. 4. The thus-formed plural windows W22 of the spacer sheet 35 are arranged in correspondence to the windows W1 to W3 of the second flexible circuit board 9. The spacer sheet 35, as described below, functions to absorb a thickness of a light-permeable member 45 which may be arranged on the light emitting diodes for the purpose of diffusing light. When the spacer layer 33 and/or second flexible circuit board 9 are formed into an increased thickness, arrangement of the spacer sheet 38 may be eliminated. An increase in thickness of the spacer layer 33 may be carried out either by increasing a thickness of the spacer layer 33 itself or by constructing the spacer layer 33 into a multi-layer structure.

Figure 2:
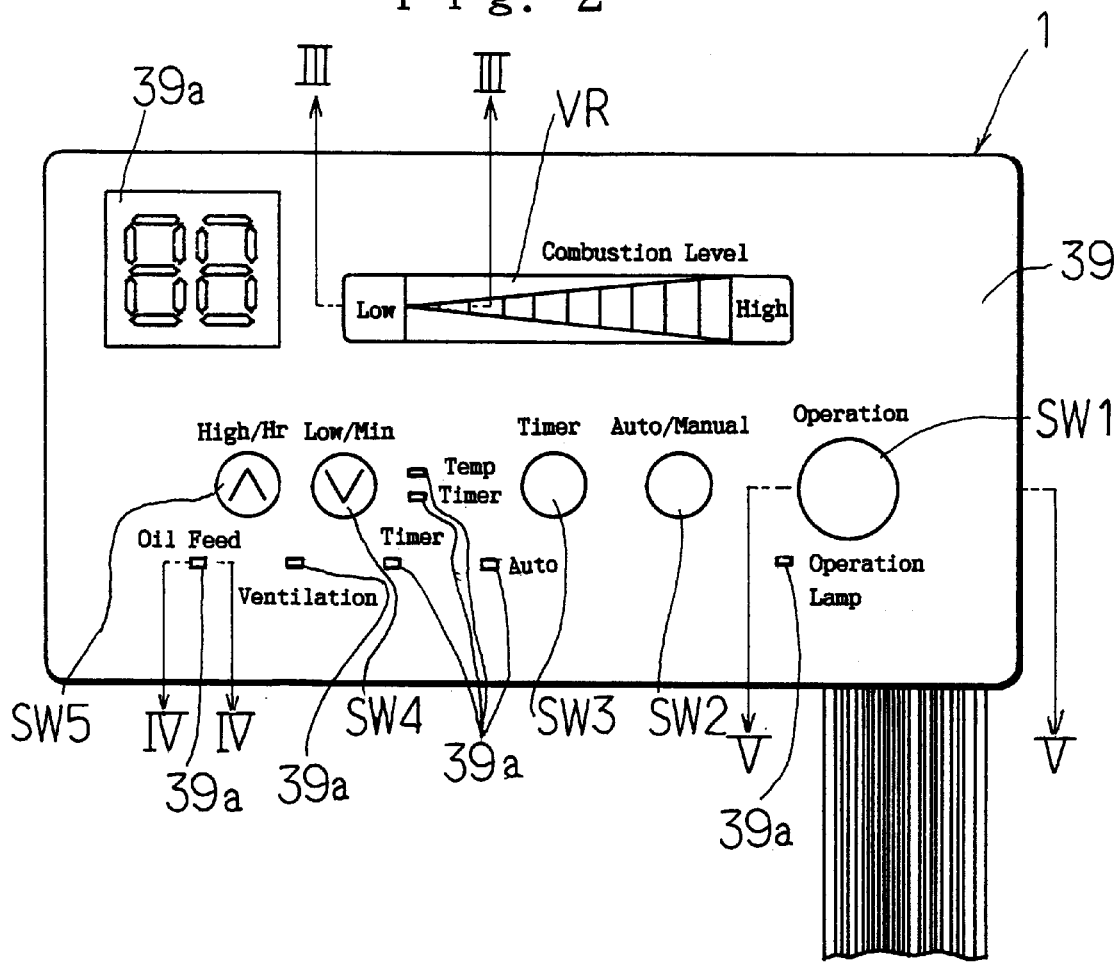
FIG. 2 is a plan view showing an embodiment of an equipment operation panel according to the present invention.

In the illustrated embodiment, as shown in FIGS. 3 to 5, the spacer sheet 35 has a cover sheet member 39 laminated thereon through a transparent adhesive layer 37 formed of an adhesive or pressure sensitive adhesive. The cover sheet member 39 is so formed that at least a portion thereof corresponding to a switch operation section and a variable resistor operation section or a portion thereof indicated at SW1 to SW5 and VR may exhibit flexibility. Also, the cover sheet member 39 is so formed that at least a portion thereof corresponding to the light emitting element is light-permeable. More particularly, the cover sheet member 39 is made of a transparent polyester film which has predetermined printing applied to a rear surface thereof in such a manner that a portion of the transparent film corresponding to the light emitting element indicated at reference character 39a in FIG. 2 is still transparent or light-permeable. In FIGS. 3 to 5, the printed film is omitted for the sake of brevity.

In the illustrated embodiment, the first flexible circuit board 7 has a reinforcing sheet 43 joined to a rear surface thereof through an adhesive layer 41 in order to reinforce the first flexible circuit board 7. However, such a reinforcing sheet 4 is not necessarily required. Thus, the first flexible circuit board 7 may be joined directly to the casing 5 of the equipment 3 through only an adhesive layer made of an adhesive or pressure-sensitive adhesive.

As shown in FIG. 3, the first flexible circuit board 7 is formed at a portion thereof on which a plurality of the filament electrodes 21 constituting the contact VR1 of the variable resistor are formed with a plurality of projections 7a. The projections 7a permit the movable-side electrode 29 and filament electrodes 21 to be contacted with each other only when an operation section of the cover sheet member 39 is pushed by force increased to a degree. A height of the projections 7a may be adjusted as desired, to thereby permit operation sensitivity of the variable resistor to be suitably adjusted. Also, in the illustrated embodiment, a plurality of the electrodes 21 arranged at both ends of the electrode array are connected to each other through the end electrodes 23 and 25 as described above, so that a minimum resistance value and a maximum resistance value may be positively inputted even when a pushing position on both ends is somewhat varied.

Also, the equipment operation panel of the illustrated embodiment includes the light-permeable member 45 briefly described above, which is made of a semitransparent plate of a plastic material such as acrylic resin and arranged so as to permit light emitted from the light emitting diode LED7 to permeate therethrough while diffusing it. Thus, the light-permeable member 45 functions to diffuse therein light emitted from the small-sized light emitting diode LED7 to enlarge a luminous area of the diode LED7. The light-permeable member 45 is provided therearound with a light-impermeable member 47 so as to prevent leakage of light in a lateral direction from the light-permeable member 45. For this purpose, the light-impermeable member 47 is made of a colored light-impermeable plastic material. The remaining light emitting diodes may be likewise constructed as shown in FIG. 4. One such light-permeable member which exhibits light diffusing properties and light-permeable properties may be arranged with respect to a plurality of the light-emitting diodes. Also, when the numeral indication segment is constituted by the light emitting diodes LED8 and LED9, one such light-impermeable member 47 formed into a large size is formed with seven holes in a letter-eight-shaped arrangement and a light-permeable member is arranged so as to cover one end of an opening of each of the holes. Then, the light emitting diodes each are arranged under the light-permeable member. Such arrangement permits a numeral to be clearly indicated by means of the light-emitting diodes.

In a region in which the push-on switches are arranged, as shown in FIG. 5, a reversible dish-like conductive member 49 which carries out a reversing action is arranged between the contact SW11 of the first flexible circuit board 7 and the contact SW21 of the second flexible circuit board 9. The contact SW11 of the first flexible circuit board 7 is covered on an outer peripheral portion thereof with an overcoat layer 17 made of an insulating material and the conductive member 49 is positioned at an outer peripheral portion thereof on the overcoat layer 17. When the cover sheet member 39 is downwardly pushed at a portion thereof corresponding to the operation section of the switch SW1, the conductive member 49 is deformed so that a central portion thereof is contacted with the contact SW11 of the first flexible circuit board 7. When the central portion of the conductive member 49 is thus contacted with the contact SW11, the contacts SW11 and SW21 are connected to each other, resulting in an operation signal being outputted. When the operation section is released from force applied thereto, the conductive member 49 carries out a reversing action, resulting in it returning to its original state. This results in the switch being turned off, to thereby interrupt outputting of the operation signal.

Figure 7:
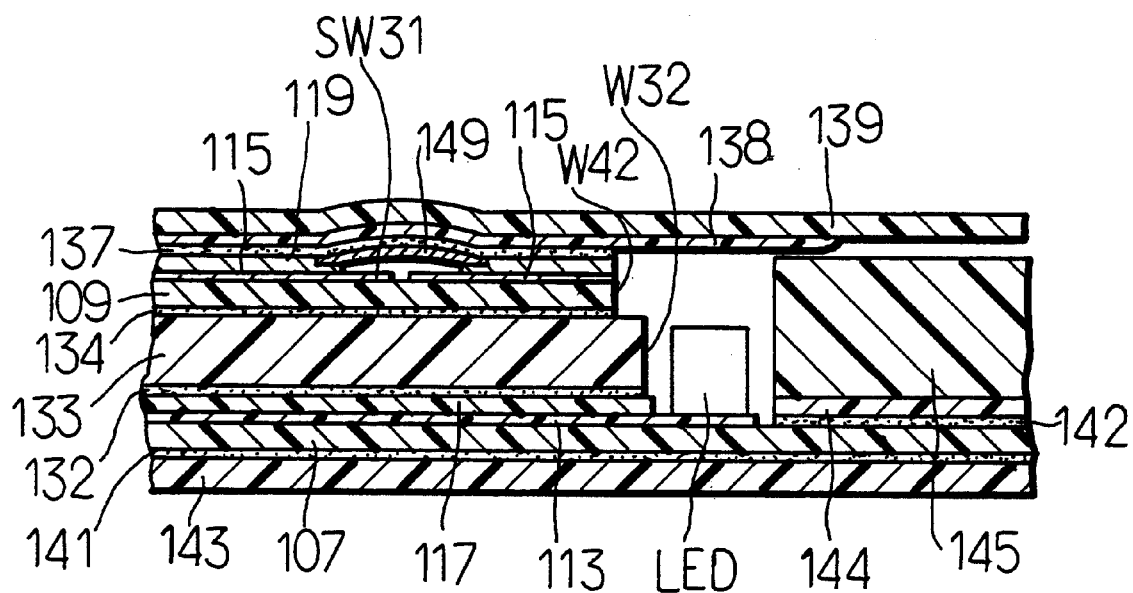
FIG. 7 is a sectional view showing an essential part of another embodiment of an equipment operation panel according to the present invention.

Referring now to FIG. 7, another or a second embodiment of an equipment operation panel according to the present invention is illustrated. In the illustrated embodiment, reference numerals correspond to those discussed in the first embodiment described above, except with an additional prefix of 100. The illustrated embodiment is different from the first embodiment described above with reference to FIGS. 2 to 6 in that a push-on switch is substituted for the above-described variable resistor as an operation signal generation electric component for feeding an operation signal to the control unit arranged in the equipment and a light-permeable member 145 is arranged beside each of light emitting diodes LED each acting as a light emitting element. Also, the illustrated embodiment is so constructed that the light emitting element is arranged on a first flexible circuit board 107 and contacts of push-on switches are arranged on a second flexible circuit board 109, unlike the first embodiment described above. Further, a spacer layer 133 arranged between the first flexible circuit board 107 and the second flexible circuit board 109 is formed into an increased thickness as compared with that in the first embodiment and therefore the spacer sheet 35 incorporated for thickness adjustment in the first embodiment is eliminated in the illustrated embodiment.

Figure 8:
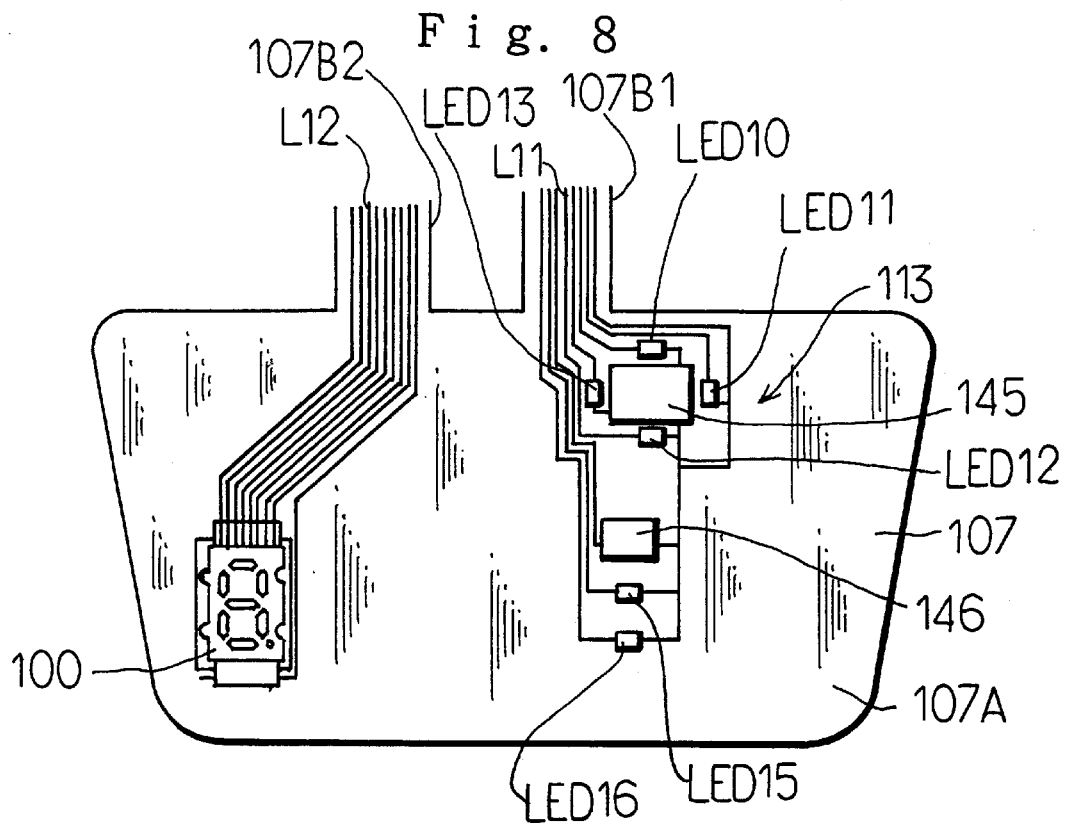
FIG. 8 is a plan view showing a first flexible circuit board incorporated in the equipment operation panel of FIG. 7.

The first flexible circuit board 107 on which the light emitting diodes LED are arranged includes such a first circuit pattern 113 as shown in FIG. 8. The first circuit pattern 113 of the first flexible circuit board 107 includes a first drive circuit wiring L11 for driving light emitting diodes LED10 to LED16 for individual display and a second drive circuit wiring L12 for driving a numeral indication segment 100. In the illustrated embodiment, the first flexible circuit board 107 includes a main section 107A having two lead-out sections 107B1 and 107B2 led out therefrom.

The light emitting diodes LED10 to LED13 each are arranged beside the single light permeable member 145 of an increased size made of an acrylic plate. The light emitting diodes LED10 and LED12 and light emitting diodes LED11 and LED13 are constructed so as to emit light of colors different from each other. Employment of the two different colors permits lights different in color to permeate through the single light-permeable member 145, to thereby indicate two identifiable states such as, for example, operation of the equipment and interruption thereof. The equipment operation panel of the illustrated embodiment, as shown in FIG. 7, includes a thin reflective film 144 arranged below the light-permeable member 145, so that light entering the light-permeable member 145 is reflected on the reflective film 144, resulting in light as much as possible being discharged from an upper surface of the light-permeable member 145. The light-permeable member 145 having the reflective film 144 attached thereto is joined to a front surface of the first flexible circuit board 107 through an adhesive layer 142. The remaining light emitting diodes LED14 to LED16 each are provided thereon with a light-permeable member 146. Arrangement of the light-permeable member 145 beside the plural light emitting diodes permits an increased luminous area, a desired elongated display and the like to be provided, as compared with arrangement of the light-permeable member 146 on each of the light emitting diodes.

Figure 9:
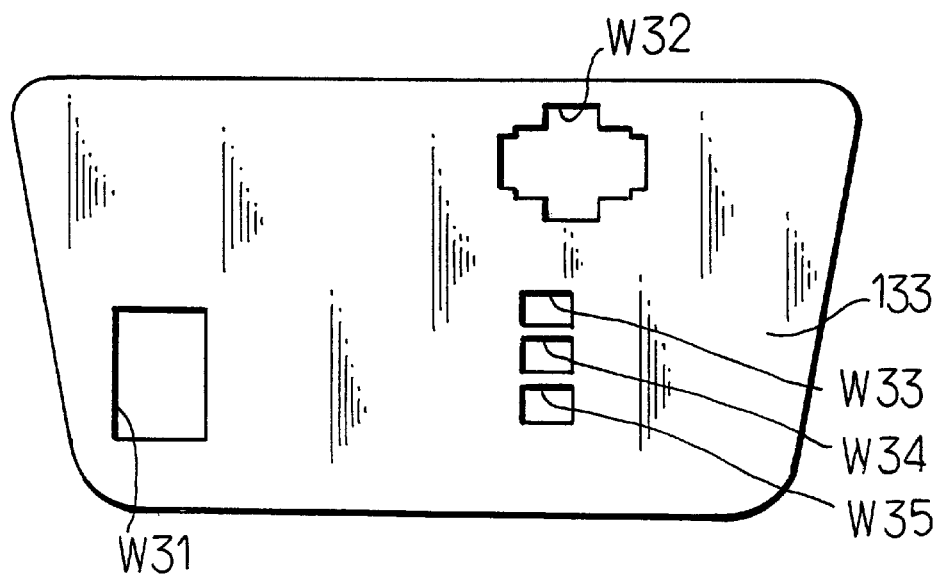
FIG. 9 is a plan view showing a first spacer layer incorporated in the equipment operation panel of FIG. 7.
Figure 10:
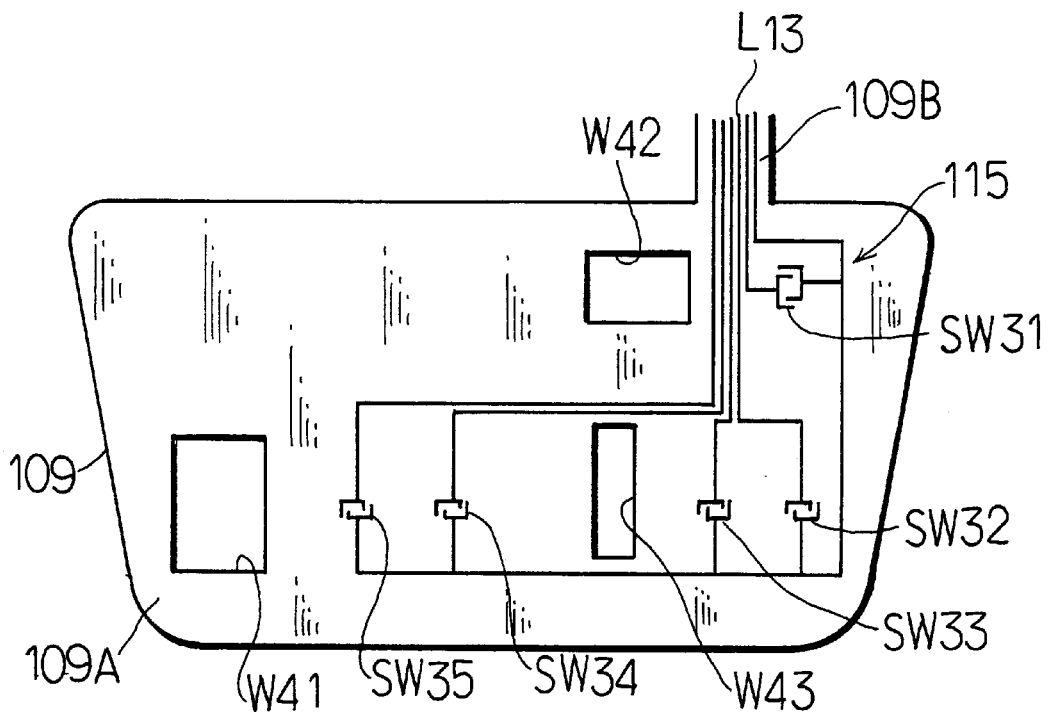
FIG. 10 is a plan view showing a second spacer layer incorporated in the equipment operation panel of FIG. 7.

The first spacer layer 133 is constructed as shown in FIGS. 7 and 9. The spacer layer 133, as shown in FIG. 7, is formed into a thickness which permits an upper or front surface of the layer 133 to be positioned above an upper surface of the light emitting diodes LED mounted on the first flexible circuit board 107. The spacer layer 133 is constructed so as to exhibit flexibility and some elasticity like that in the first embodiment described above. The spacer layer 133 is formed with five windows W31 to W32 for receiving the light emitting element therein. The spacer layer 133 is provided on both surfaces thereof with adhesive layers 132 and 134, respectively, which are made of a pressure-sensitive adhesive.

The second flexible circuit board 109 is mounted on the first spacer layer 133 through the adhesive layer 134. The second flexible circuit board 109 is provided on a front surface thereof or a surface thereof non-opposite to the first spacer layer 133 with a second circuit pattern 115 including contacts SW31 to SW35 of five push-on switches SW21 to SW25. The contacts SW31 to SW35 each are constituted by a pair of opposite electrodes, which are short-circuited by a conductive member 149 (FIG. 7) of a reversible dish-like shape constructed so as to carry out a reversing action, so that the push-on switches each may be turned on, resulting in an operation signal being outputted. The second flexible circuit board 109 includes a main section 109A and a lead-out section 109B, through which a connection wire pattern L13 is led out.

The second flexible circuit board 109 is formed on the front surface thereof except the contacts SW31 to SW35 of the second circuit pattern 115 with an insulating overcoat layer 119, which is made of an insulating resin paste by screen printing. The overcoat layer 119 constitutes a second spacer layer and is constructed so that a portion thereof covering an outer edge of the contacts SW31 to SW35 provides a window in which the reversible conductive member 149 of a dish-like shape is received. The conductive member 149 is arranged on the contact SW31 through the overcoat layer 119. Thus, when the conductive member 149 is pushed at a central portion thereof, resulting in the central portion being contacted with both electrodes in a pair constituting the contact SW31, the switch is turned on, so that an operation signal may be outputted. When it is required to further increase a thickness of the second spacer layer, the overcoat layer 119 may be constructed into a multi-layer structure. Alternatively, a spacer sheet made of an insulating sheet material may be laminated on the overcoat layer 119.

A cover sheet member 139 is provided on a lower surface thereof with a light-impermeable layer 138, which may be made of a light-impermeable paint by printing. The cover sheet member 139 is formed of a polyester film exhibiting both flexibility and light-permeability, so that portions 139a to 139c of the cover sheet member 139 on which the light-impermeable layer 138 each act as a luminous section. Intensity of light may be adjusted depending on suitable selection of a refractive index of each of the light-permeable member 145 and cover sheet member 139, transparency thereof, and the like. Suitable selection of a material for the cover sheet member 139 permits the light-permeable portions 139a to 139c of the cover sheet member 139 to exhibit the same function as the light-permeable member 145. This eliminates arrangement of the light-permeable member 145.

Figure 11:
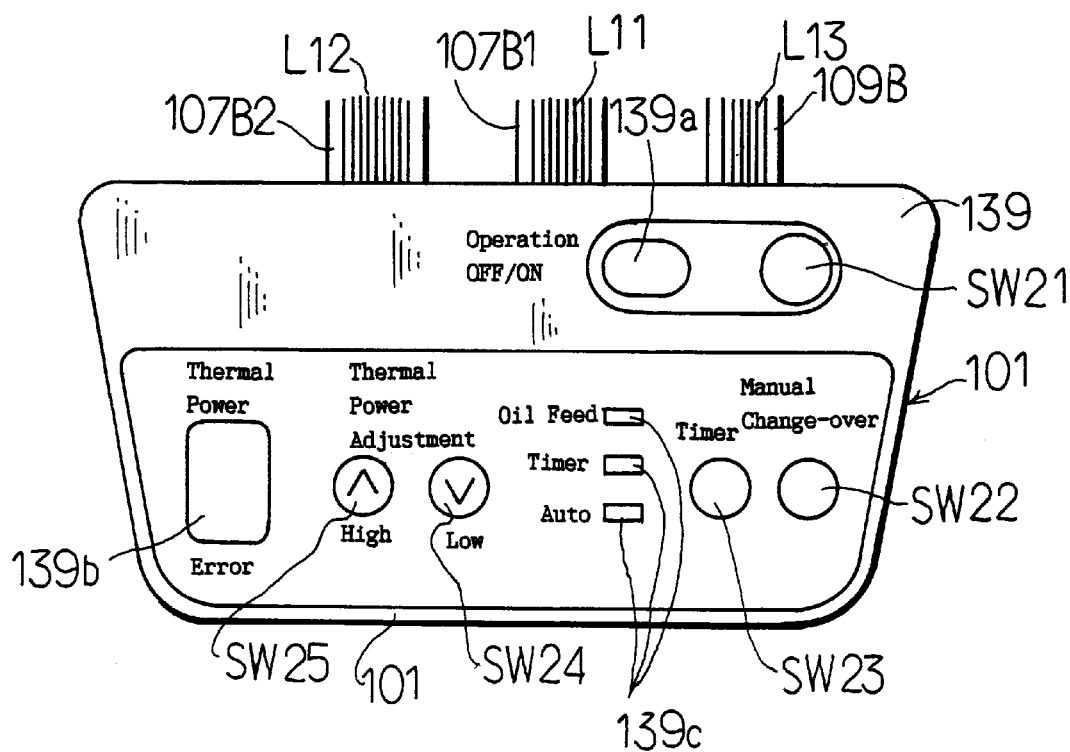
FIG. 11 is a plan view of the equipment operation panel shown in FIG. 7.
Figure 12:
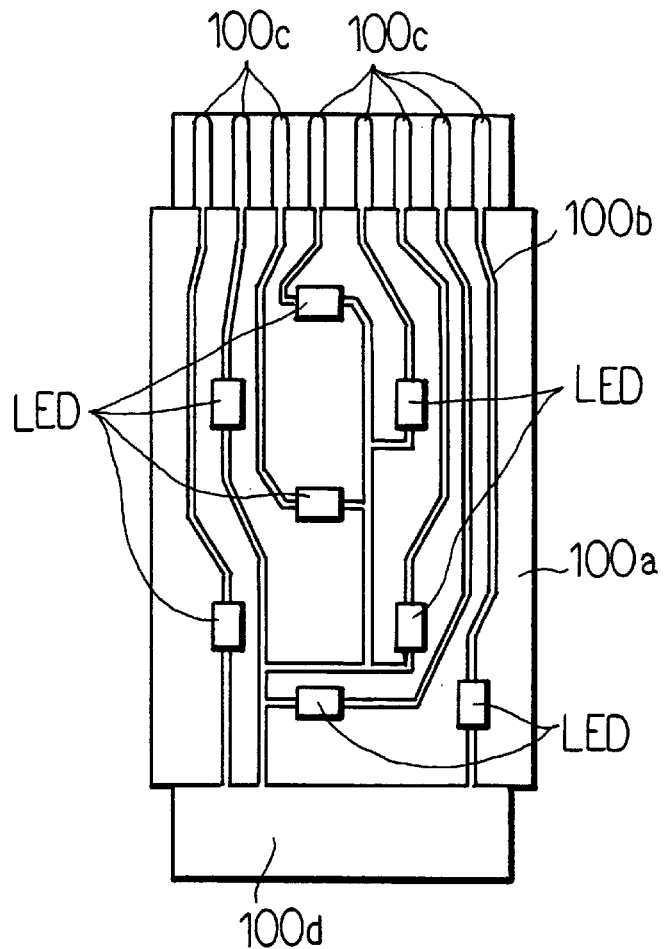
FIG. 12 is a plan view showing a circuit board for a numeral indication segment.
Figure 13:
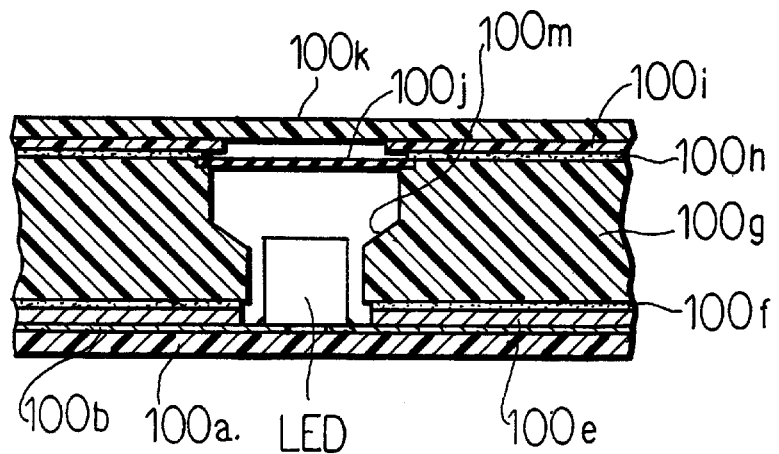
FIG. 13 is a sectional view showing an essential part of a numeral indication segment.

Now, the equipment operation panel of the second embodiment will be further described with reference to FIGS. 11 and 12, wherein FIG. 11 shows an equipment operation panel 101 in plan and FIG. 12 shows a circuit board 100a for a numeral indication segment 100 in plan. The circuit board 100a is formed therein with a circuit pattern 100b which is constructed so as to permit seven light emitting diodes LED to constitute seven segments and each one light emitting diode LED to constitute one point or dot. In the illustrated embodiment, the circuit board 100a is made of polyimide resin and the circuit pattern is formed by subjecting a copper foil stuck onto the circuit board to etching. The circuit board 100a is formed on one end thereof with eight electrodes 100c for connection and on the other end thereof with a ground electrode 100d. The electrodes 100c and 100d which are made of a copper foil each are connected to the circuit pattern 113 of the first circuit board 107 or an end of the connection wire pattern 112 by plasma welding.

In the illustrated embodiment as well, a back plate 413 may be arranged as desired.

The circuit board 100a is covered on a surface thereof, except an electrode section thereof on which the light emitting diodes LED are arranged, with an insulating overcoat layer 100e. The overcoat layer 100e is laminatedly formed thereon through an adhesive layer 100f with a spacer member 100g. The spacer member 100g is made of a light-impermeable material and formed with eight windows 100m for receiving the light emitting diodes LED therein. The eight windows 100m each are fitted in an upper opening thereof with a light-permeable plate 100j which may be made of a light-permeable acrylic plate or the like. The spacer member 100g is laminatedly formed thereon with a cover sheet 100k which is formed on a rear surface thereof with a light-impermeable layer 100i by printing. The light-impermeable layer 100i is provided at a portion thereof positionally corresponding to the light-permeable plate 100j with a light-permeable section. Such arrangement of the plural light emitting diodes on the circuit board permits any suitable general-purpose element which is commercially available to be used for each of the numeral indication segments 100.

In the illustrated embodiment, the light-permeable member 145 is arranged beside the light emitting element. Such arrangement may be applied to the first embodiment described above with reference to FIGS. 2 to 6.

Figure 14:
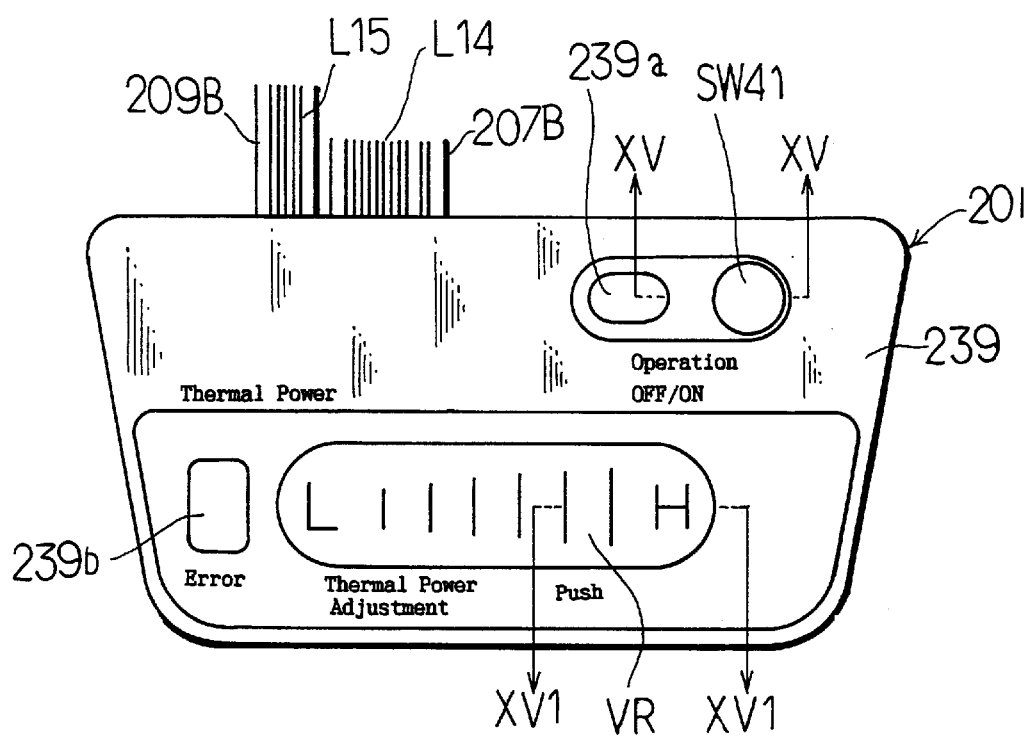
FIG. 14 is a plan view showing a third embodiment of an equipment operation panel according to the present invention.

Referring now to FIG. 14, a third embodiment of an equipment operation panel according to the present invention is illustrated. An equipment operation panel of the illustrated embodiment which is generally designated at reference numeral 201 includes a variable resistor constructed in a novel manner so as to act as a signal generation electric component, as well as a third flexible circuit board 257 for constituting the variable resistor, unlike the equipment operation panel 101 shown in FIGS. 7 to 13. In connection with the illustrated embodiment, reference numerals correspond to the reference numerals discussed in the second embodiment of FIGS. 7 to 13, except with an additional prefix of 100 such that the equipment operation panel 101 previously shown is now the equipment operation panel 201.

Figure 17:
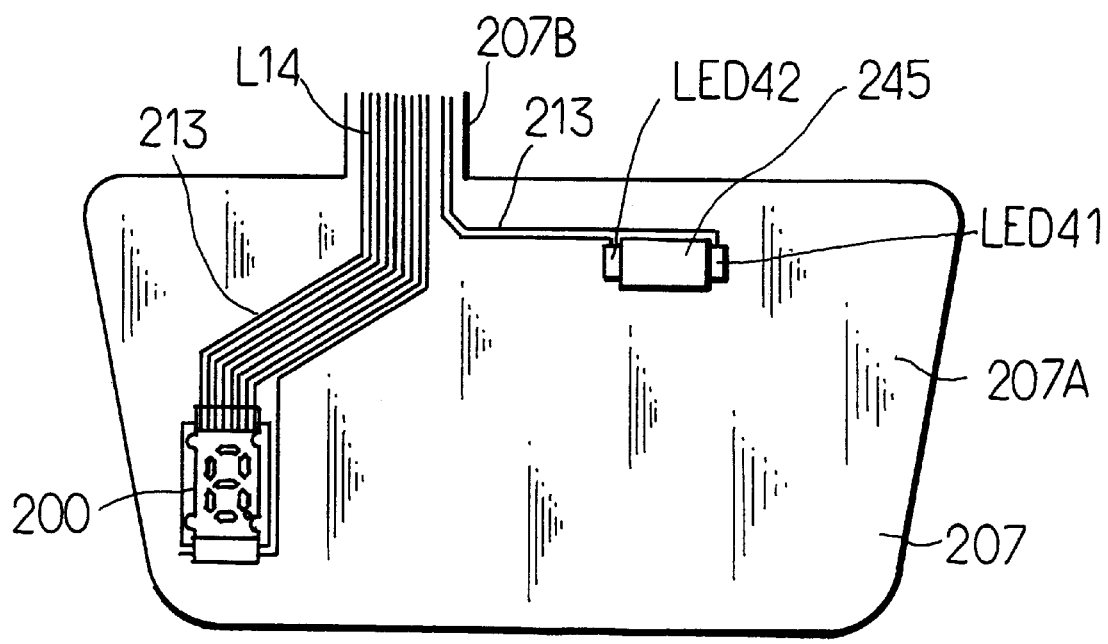
FIG. 17 is a plan view showing a first flexible circuit board incorporated in the equipment operation panel of FIG. 14.

In the third embodiment as well, as shown in FIG. 17, a first flexible circuit board 207 is formed on a front surface thereof with a first circuit pattern 213, to which only light emitting diodes LED41 and LED42 and a numeral indication segment 200 are connected. Between two such light emitting diode LED41 and LED42 is arranged a light-permeable member which permits light emitted from the light emitting diodes to permeate therethrough while diffusing the light. The first flexible circuit board 207 includes a main section 207A and a lead-out section 207B arranged so as to extend from the main section 207A. The lead-out section 207B is formed with a connection pattern L14 connected to the first circuit pattern 213.

The first flexible circuit board 207 is formed thereon with a first spacer layer 233 which is provided on both upper and lower surfaces thereof with adhesive layers 232 and 234 each made of an adhesive or pressure sensitive adhesive, respectively. The first spacer layer 233 is made of the same material as that for the spacer layer 33 described above and formed with two windows for receiving two light emitting diodes therein.

Figure 18:
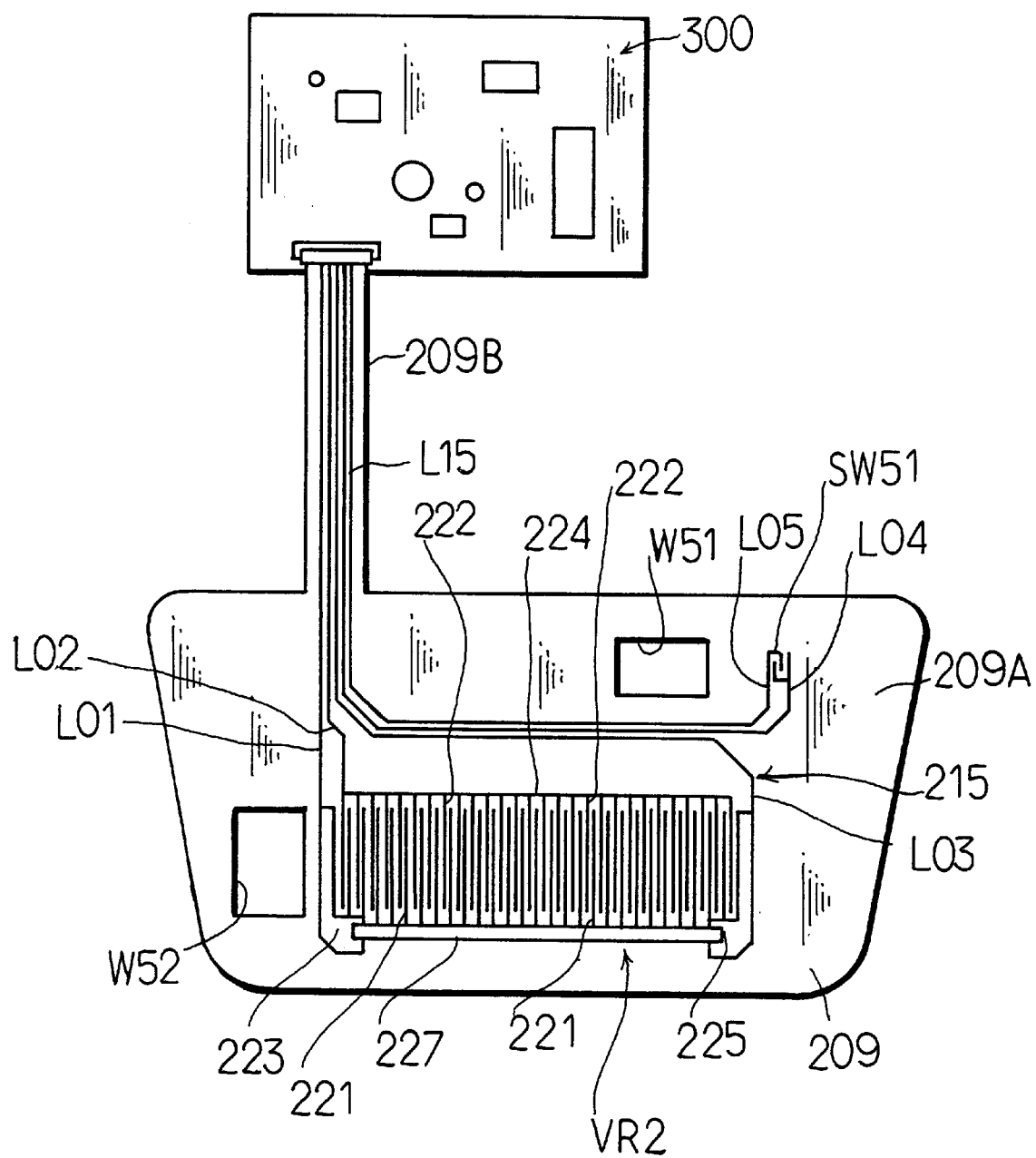
FIG. 18 is a plan view showing a second flexible circuit board incorporated in the equipment operation panel of FIG. 14.

The first spacer layer 233 is laminatedly formed thereon with a second flexible circuit board 209, which may be constructed in such a manner as shown in FIG. 18, in which a control unit 300 is shown for the sake of convenience as well. The second flexible circuit board 209 is formed on a front surface thereof with a second circuit pattern 215 including a contact SW51 of a push-on switch SW41 and a contact VR2 of a variable resistor. The contact SW51 is constructed of a pair of electrodes arranged as both ends of wirings L04 and L05 so as to be opposite to each other. The contact VR2 of the variable resistor is constructed of a first filament electrode group including a plurality of filament electrodes 221 arranged on the front surface of the second flexible circuit board 209 so as to be spaced from each other at predetermined intervals and a second filament electrode group including a plurality of filament electrodes 222 arranged between the filament electrodes 221 so as to alternate with the filament electrodes 221 and electrically connected to each other through a connection wire 224. A plurality of filament electrodes 221 positioned at both ends of the first filament electrode group constituted by the filament electrodes 221 are electrically connected to each other by means of end electrodes 223 and 225. The end electrodes 223 and 225 are connected to wirings L01 and L03, respectively. The connection wire 224 through which the plural filament electrodes 222 constituting the second filament electrode group is connected at an end thereof to a wiring L02. The end electrodes 223 and 225 and the plural filament electrodes 221 constituting the first filament electrode group are formed at an end thereof with a common thin or thick resistive film 227 for electrically connecting the filament electrodes 221 to each other. The second flexible circuit board 209 includes a main section 209A and a lead-out section 209B arranged so as to extend from the main section 209A and formed with a connection wire pattern L15. The lead-out section 209B of the second flexible circuit board 209 is provided at an end thereof with a connector connection electrode. In practice, the end electrode of the lead-out section 209B is inserted into a connector of the control unit 300 arranged in an equipment on which the equipment operation panel is mounted and the second circuit pattern 215 of the second flexible circuit board 209 is electrically connected to an internal circuit of the control unit. The control unit 300 carries out predetermined control depending on an operation signal fed thereto from the switch or variable resistor. The control unit 300 also has the lead-out section 207B of the first flexible circuit board 207 connected thereto, so that the control unit 300 may output a drive signal to the light emitting element constituted by the light emitting diodes.

Figure 19:
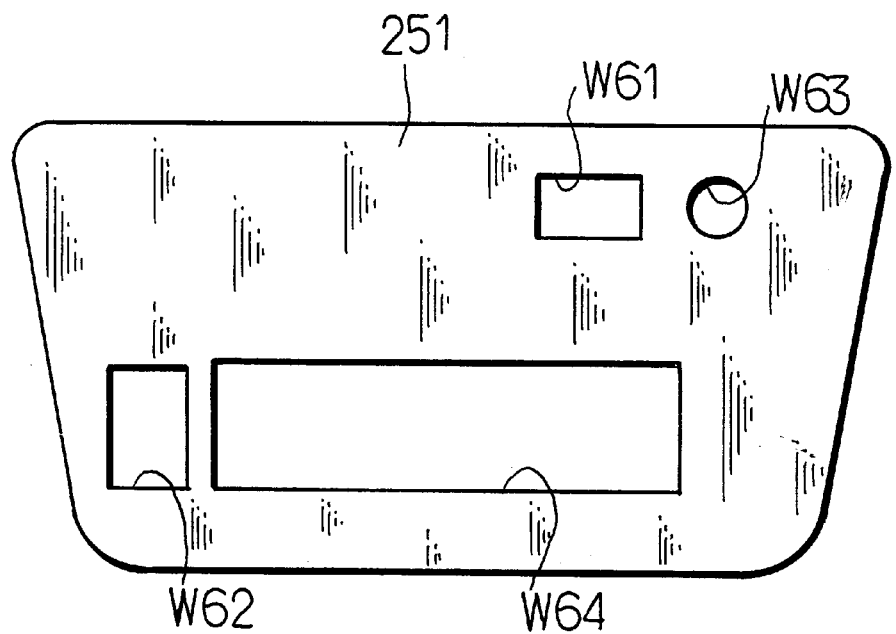
FIG. 19 is a plan view showing a second spacer layer.

The second flexible circuit board 209 is formed on a portion of the front surface thereof except the contacts SW51 and VR2 with an insulating layer 219, which is made of an insulating resin paste or insulating paint by screen printing. The same insulating paint is used for formation of a plurality of dot-like insulating spacers 216 arranged in a longitudinal direction of the filament electrodes 221 and 222 on some of the filament electrodes. The second flexible circuit board 209 is formed with windows W51 and W52 for receiving the light emitting element therein. Also, the second flexible circuit board 209 is laminatedly formed thereon with a second spacer layer 251 through an adhesive layer 252 as shown in FIG. 19. The second spacer layer 251 may be made of the same insulating material as the first spacer layer 233. The second spacer layer 251 is formed with four windows W61 to W64 for receiving therein the contacts SW51 and VR2 provided on the first flexible circuit board 209.

Figure 15:
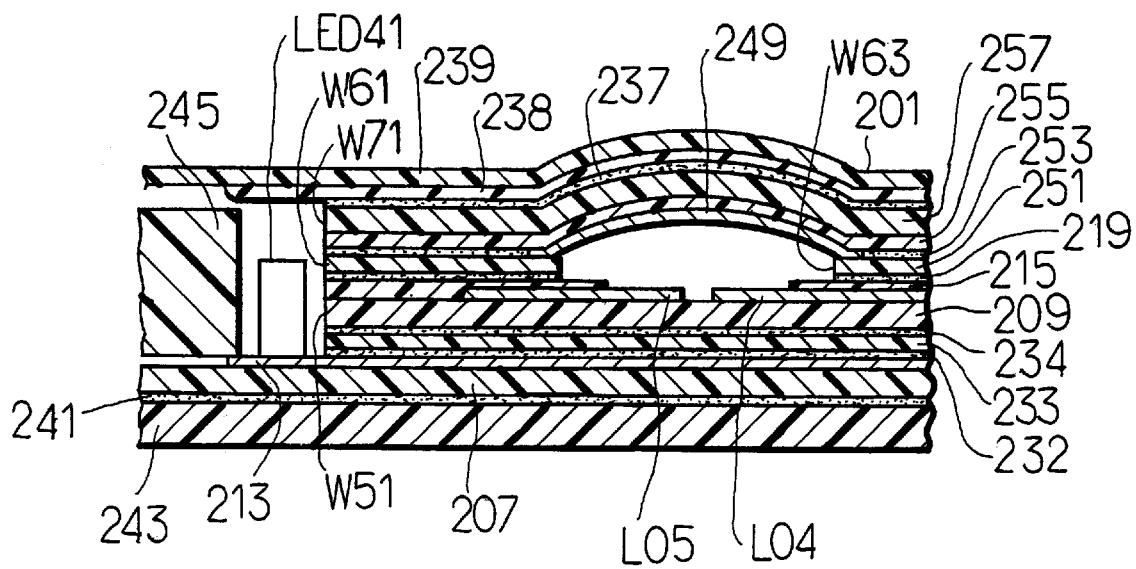
FIG. 15 is a sectional view taken along line XV—XV of FIG. 14.
Figure 16:
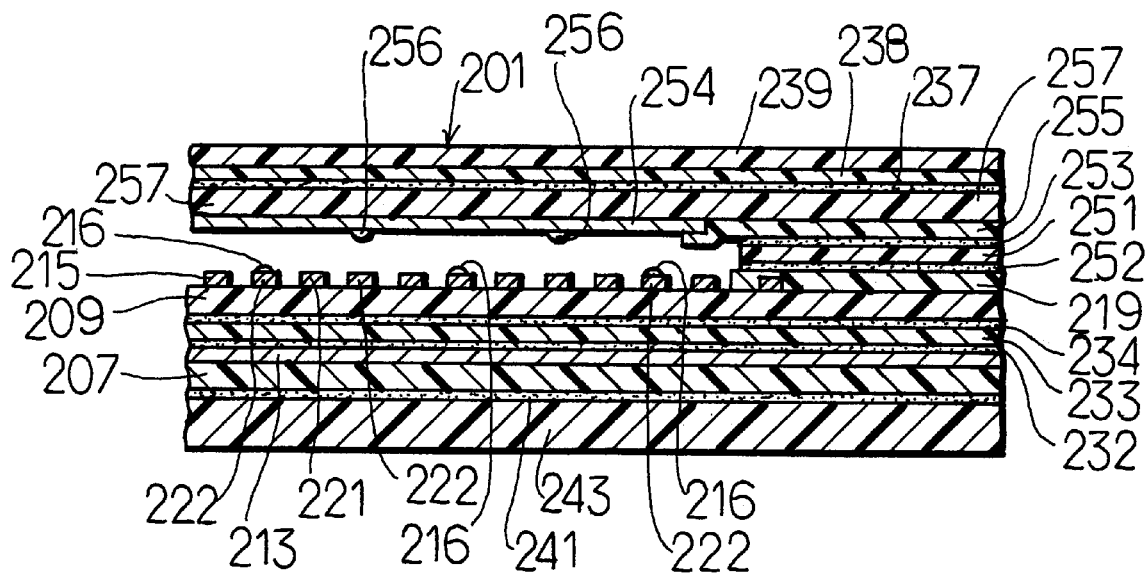
FIG. 16 is a sectional view taken along line XVI—XVI of FIG. 14.
Figure 20:
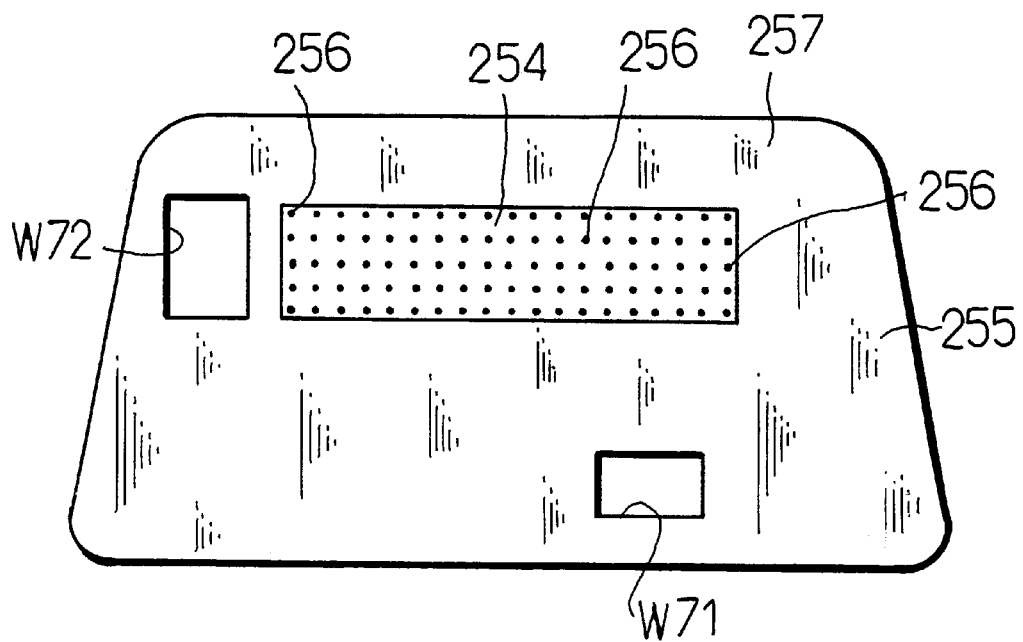
FIG. 20 is a bottom view showing a third flexible circuit board incorporated in the equipment operation panel of FIG. 14.

The second spacer layer 251 has a third flexible circuit board 257 laminated thereon. The third flexible circuit board 257, as shown in FIG. 20, is formed on a rear surface thereof or a surface thereof opposite to the second spacer layer 251 with a third circuit pattern. In the illustrated embodiment, the third circuit pattern is constituted by a contact pattern or conductive member 254 contactable with the plural filament electrodes 221 and 222 of the contact VR2 of the variable resistor formed on the second flexible circuit board 209. The conductive member 254 may be formed by printing of a conductive paste such as a silver paint. The third flexible circuit board 257, as shown in FIGS. 15 and 16, is formed on a portion of the rear surface thereof except the conductive member 254 with an insulating layer 255, which may be made of an insulating resin paste or insulating paint. In the illustrated embodiment, the insulating layer 255 is arranged for the purpose of preventing formation of a step due to arrangement of the conductive member 254. Thus, a reduction in thickness of the conductive member 254 and/or an increase in thickness of the adhesive layer 219 may eliminate a necessity of arrangement of the insulating layer 255. Also, the conductive member 254 is formed on a portion thereof opposite to some of the filament electrodes 221 and 222 with a plurality of dot-like insulating spacers 256 in a longitudinal direction of the filament electrodes 221 and 222. The spacers 256 may be made of the same insulating paint as the insulating layer 255 and formed concurrently with formation of the insulating layer 255. The insulating spacers 216 and insulating spacers 256 are arranged so as to alternate with each other, resulting in then being prevented from being opposite to each other. The third flexible circuit board 257 is formed with windows W71 and W72 for receiving the light emitting diodes for the light emitting element therein or permeating light of the light emitting element therethrough. The third flexible circuit board 257 is laminated on the second spacer layer 251 through the adhesive layer 253. Also, the third flexible circuit board 257 is laminatedly mounted thereon through an adhesive layer 237 with a cover sheet member 239, which is provided on a rear surface thereof with a light-impermeable layer 238. The cover sheet member 239, as shown in FIG. 14, is provided at five positions thereof with light-permeable sections as indicated at reference characters 239a to 239c.

When a portion of the cover sheet member 239 positionally corresponding to the variable resistor is pushed by a finger to contact a conductive member 245 provided on the third flexible circuit board 257 with the filament electrodes 221 and 222 constituting the contact of the variable resistor, a part of the filament electrodes 221 and a part of the filament electrodes 222 are electrically connected to each other through the conductive member 245, so that an operation signal proportional to the resistance value may be obtained between the wiring L01 (end electrode 223) and the wiring L02 or connection wire 224 or between the wiring L02 or connection wire 224 and the wiring L03 (end electrode 235).

The operation signal proportional to the resistance value is processed in any desired manner in the control unit 300. For example, it may process, as its input resistance value, values of a plurality of the operation signals read therein over a predetermined cycle when the values are coincident with each other at a predetermined level or more.

In the illustrated embodiment, as shown in FIG. 15, a conductive member 249 of the switch is separately provided as in the first and second embodiments described above. Alternatively, the conductive member 249 may be formed of a conductive paste such as a silver paste or the like during arrangement of the conductive member 254 on the third flexible circuit board 257. So long as the third flexible circuit board 257 exhibits suitable flexibility, a satisfactory switching function may be obtained without using the dish-like conductive member 249 which exhibits a reversing action. In the illustrated embodiment as well, a back plate 243 may be arranged as desired.

The construction of the variable resistor shown in FIGS. 14 to 20 may be of course applied to the equipment operation panel of the first embodiment shown in FIGS. 2 to 6. Likewise, the construction of the variable resistor shown in FIGS. 2 to 6 may be suitably applied to the equipment operation panel of FIGS. 14 to 20. Also, the construction of the switch shown in FIGS. 4 to 6 may be of course applied to the equipment operation panel shown in FIGS. 14 to 20. In this instance, the third flexible circuit board 247 may be likewise provided with a lead-out section from which the laminate is led out.

In each of the embodiments described above, the switches, the variable resistor and the light emitting element constructed of the light emitting diodes are received in the equipment operation panel 1. In addition, a chip-like microcomputer for generating the drive signal for driving the light emitting element and electric components constituting any other processing circuit may be received in the equipment operation panel 1.

As can be seen from the foregoing, the equipment operation panel of the present invention is so constructed that the main section of the equipment operation panel is constructed in the form of the laminate and the lead-out section constituting a part of the flexible circuit board is led out of the laminate. Such construction permits mounting of the equipment operation panel on the equipment to be highly readily accomplished by merely introducing the lead-out section into the casing of the equipment wire and mounting the laminate on the outer surface of the casing and facilitates connection of the panel to the control unit arranged in the equipment.

Also, the equipment operation panel of the present invention, when the variable resistor is incorporated therein, permits a desired resistance value to be selectively obtained by only contact, so that a reduction in thickness of the equipment operation panel is effectively attained.

Further, the present invention may be so constructed that the light emitting element is on the lower flexible circuit board and the contacts of the operation signal generation electric component such as the switch, variable resistor or the like are arranged on the upper flexible circuit board. Such construction ensures positive operation of the operation signal generation electric component while preventing an increase in distance between the electric component and the conductive member of the movable contact even when the light emitting diodes for the light emitting element are large-sized or the light permeable member is arranged in association with the light emitting element.

Moreover, the light-permeable member for diffusing light emitted from the light emitting element may be arranged above or beside the light emitting element. This enlarges an area for luminous display and provides a luminous display section of any desired configuration.

While preferred embodiments of the invention have been described herein with a certain degree of particularity with reference to the accompanying drawings, obvious modifications and variations are possible in light of the above teachings. It is therefore to be understood that within the scope of the appended claims, the invention may be practiced otherwise than as specifically described.

What is claimed is:

1. An equipment operation panel including an operation signal generation electric component for feeding an operation signal to a control unit arranged in an equipment and fixed on a casing of the equipment, comprising:
   a first flexible circuit board including a main section formed thereon with a first circuit pattern including contacts of said operation signal generation electric component and a leadout section arranged so as to extend from said main section and formed with a plurality of connection wire patterns connected to said first circuit pattern, said main section and lead-out section being arranged on a front surface of said first flexible circuit board, said main section of said first flexible circuit board being joined on a rear surface thereof to an outer surface of said casing of said equipment;
   a spacer layer provided with windows for exposing said contacts therethrough and laminated on said front surface of said first flexible circuit board;
   conductive members arranged in correspondence to said windows to generate said operation signal by contact with said contacts;
   a second flexible circuit board laminated on said spacer layer and including a second circuit pattern which includes or is electrically connected to said conductive members; and
   a cover sheet member laminated on said second flexible circuit board and formed so that at least a portion thereof corresponding to said conductive members exhibits flexibility;
   said main section of said first flexible circuit board, said spacer layer, said second flexible circuit board and said cover sheet member being laminated on each other in turn to provide a single laminate;
   said lead-out section of said first flexible circuit board being led out of said laminate in a manner to be insertable into said equipment.

2. An equipment operation panel including an operation signal generation electric component comprising at least one of one or more switches said one or more variable resistors, said operation signal generation electric component provided for feeding an operation signal to a control unit arranged in an equipment and a light emitting element for displaying an operation state of the equipment and fixed on a casing of the equipment, comprising:
   a first flexible circuit board including a main section formed thereon with a first circuit pattern which includes contacts of said operation signal generation electric component and said light emitting elements electrically connected to said first circuit pattern, and including a lead-out section arranged so as to extend from said main section and formed with a plurality of connection wire patterns connected to said first circuit pattern, said main section and lead-out section being arranged on a front surface of said first flexible circuit board and said light emitting element being fixed on said front surface of said first flexible circuit board;
   a spacer layer provided with a plurality of windows for receiving said contacts and light emitting element therein and laminated on said front surface of said first flexible circuit board;
   conductive members arranged in correspondence to said windows corresponding to said contacts of said spacer layer to generate said operation signal by contact with said contacts;
   a second flexible circuit board laminated on said spacer layer, provided at a portion thereof corresponding to said light emitting element with windows or constructed so that said portion exhibits light-permeability, and including a second circuit pattern which includes or is electrically connected to said conductive members; and
   a cover sheet member laminated on said second flexible circuit board and formed so that at least a portion thereof corresponding to said conductive members exhibits flexibility and at least a portion thereof corresponding to said light emitting element exhibits light-permeability;
   said main section of said first flexible circuit board, said spacer layer, said second flexible circuit board and said cover sheet member being laminated on each other in turn to provide a single laminate,
   said lead-out section of said first flexible circuit board being led out of said laminate in a manner to be insertable into said equipment.

3. An equipment operation panel as defined in claim 2, wherein said light emitting element comprises at least one light emitting diode; and said window for receiving said light emitting element therein is provided therein with a light-permeable member which permits light emitted from said light emitting diode to permeate therethrough while diffusing the light.

4. An equipment operation panel as defined in claim 3, wherein said light-permeable member is arranged above said at least one light emitting diode.

5. An equipment operation panel as defined in claim 4, wherein said light-permeable member is arranged beside said at least one light emitting diode; and a portion of said cover sheet member corresponding to said light emitting diode is constructed so as to permit only light discharged through said light-permeable member to permeate therethrough.

6. An equipment operation panel as defined in claim 4, wherein a plurality of said light emitting diodes different in luminous color are arranged beside said light-permeable member; and a portion of said cover sheet member corresponding to said light emitting diode is constructed so as to permit only light discharged through said light-permeable member to permeate therethrough.

7. An equipment operation panel including an operation signal generation electric component for feeding an operation signal to a control unit arranged in an equipment and a light emitting element for displaying an operation state of the equipment and fixed on a casing of the equipment, comprising:

a first flexible circuit board including a main section fixedly mounted thereon with a first circuit pattern and said light emitting element electrically connected to said first circuit pattern and a lead-out section arranged so as to extend from said main section and formed with a plurality of connection wire patterns connected to said first circuit pattern, said main section and lead-out section being arranged on a front surface of said first flexible circuit board and said light emitting element being fixed on said main section, said main section of said first flexible circuit board is joined on a rear surface thereof to an outer surface of said casing of said equipment;

a first spacer layer provided with windows for receiving said light emitting element therein and laminated on said front surface of said first flexible circuit board;

a second flexible circuit board including a main section laminated on said first spacer layer, formed on a front surface thereof with a second circuit pattern including contacts of said operation signal generation electric component and forced at a portion thereof corresponding to said light emitting element with windows, and a lead-out section arranged so as to extend from said main section and forced with a plurality of connection wire, patterns connected to said second circuit pattern;

a second spacer layer provided with at least one window for exposition said contacts therethrough and windows corresponding to said light emitting element and laminated on said front surface and said second flexible circuit board;

a conductive member arranged in correspondence to said windows of said second spacer layer to generate said operation signal by contact with said contacts; and a cover sheet member laminated on said second spacer and constructed so that at least a portion thereof corresponding to said conductive member exhibits flexibility;

said main section of said first flexible circuit board, said first spacer layer, said main section of second flexible circuit board, said second spacer layer and said cover sheet member being laminated on each other in turn to provide a single laminate;

said lead-out section of each of said first and second flexible circuit boards being led out of said laminate in a manner to be insertable into said equipment.

8. An equipment operation panel including an operation signal generation electric component for feeding an operation signal to a control unit arranged in an equipment and a light emitting element for displaying an operation state of the equipment and fixed on a casing of the equipment, comprising:

a first flexible circuit board including a main section fixedly mounted thereon with a first circuit pattern and said light emitting element electrically connected to said first circuit pattern and a lead-out section arranged so as to extend from said main section and formed with a plurality of connection wire patterns connected to said first circuit pattern, said main section and lead-out section being arranged on a front surface of said first flexible circuit board;

a first spacer layer provided with windows for receiving said light emitting element therein and laminated on said front surface of said first flexible circuit board;

a second flexible circuit board including a main section laminated on said first spacer layer, formed on a front surface thereof with a second circuit pattern including contacts of said operation signal generation electric component and formed at a portion thereof corresponding to said light emitting elements with windows, and a lead-out section arranged so as to extend from said main section and formed with a plurality of connection wire patterns connected to said second circuit pattern;

a second spacer layer provided with at least one window for exposing said contacts therethrough and windows corresponding to said light emitting elements and laminated on said front surface of said second flexible circuit board;

conductive members arranged in correspondence to said windows of said second spacer layer to generate said operation signal by contact with said contacts;

a third flexible circuit board laminated on said second spacer layer and including a third circuit pattern which includes said conductive member or is electrically connected to said conductive member; and a cover sheet member laminated on said third flexible circuit board and constructed so that at least a portion thereof corresponding to said conductive members exhibits flexibility;

said main section of said first flexible circuit board, said first spacer layer, said main section of said second flexible circuit board, said second spacer layer, said third flexible circuit board and said cover sheet member being laminated on each other in turn to provide a single laminate;

said lead-out section of each of said first and second flexible circuit boards being led out of said laminate in a manner to be insertable into said equipment.

9. An equipment operation panel as defined in claim 8, wherein said third flexible circuit board includes a lead-out section formed with a plurality of connection wire patterns connected to said third circuit pattern;

said lead-out section of said third flexible circuit board being led out of said laminate.

10. An equipment operation panel as defined in claim 8 or 9, wherein said main section of said first flexible circuit board is joined on a rear surface thereof to an outer surface of said casing of said equipment.

11. An equipment operation panel as defined in claim 8, wherein said operation signal generation electric component comprises at least one of one or more switches and one or more variable resistors.

12. An equipment operation panel as defined in claim 8, wherein said operation signal generation electric component comprises a variable resistor;

said variable resistor including:
   said contacts constituted by a plurality of filament electrodes arranged on said front surface of said second flexible circuit board so as to be spaced from each other at predetermined intervals,
   a thin or thick resistive film formed on said front surface of said second flexible circuit board to electrically connect said plural filament electrodes to each other therethrough, and
   said conductive member incorporated in said third circuit pattern of said third flexible circuit board and positioned opposite to said plural filament electrodes; and
   said second circuit pattern and third circuit pattern are constructed so as to provide said operation signal proportional to a resistance value between at least one said filament electrode positioned at one end of said resistive film and said conductive members.

13. An equipment operation panel as defined in claim 8, wherein said operation signal generation electric component comprises a variable resistor;

said variable resistor including:
   said contacts constructed of a first filament electrode group including a plurality of filament electrodes arranged on said front surface of said second flexible circuit board so as to be spaced from each other at predetermined intervals and a second filament electrode group including a plurality of filament electrodes arranged in a manner to alternate with said plural filament electrodes of said first filament electrode group therebetween, to thereby be prevented from being contacted with said plural filament electrodes of said first filament electrode group and electrically connected to each other by means of a connection wire,
   a thin or thick resistive film formed on said front surface of said second flexible circuit board to electrically connect said plural filament electrodes of said first filament electrode group to each other therethrough, and
   said conductive member arranged opposite to said first and second filament electrode groups and incorporated in said third circuit pattern of said third flexible circuit board; and
   said second circuit pattern are constructed so as to provide said operation signal proportional to a resistance value between at least one said filament electrode positioned at one end of said first filament electrode group and said connection wire.

14. An equipment operation panel as defined in claim 13, further comprising a plurality of dot-like insulating spacers arranged on at least one of said plural filament electrodes of said first and second filament electrode groups and a portion of said conductive member opposite to said plural filament electrodes in a manner to be spaced from each other at predetermined intervals in a longitudinal direction of said filament electrodes;

said insulating spacers being formed of an insulating paint by printing.

15. An equipment operation panel as defined in claim 8, wherein said light emitting element comprises a chip-like light emitting diode; and said windows for receiving said light emitting element therein each are provided therein with a light-permeable member which permits light emitted from said light emitting diode to permeate therethrough while diffusing the light.

16. An equipment operation panel as defined in claim 8, wherein said light emitting element comprises a plurality of chip-like light emitting diodes; and said light-permeable member is arranged above a plurality of said light emitting diodes.

17. An equipment operation panel as defined in claim 8, wherein said light emitting element comprises a plurality of chip-like light emitting diodes each emitting light in a lateral direction;

said light emitting diodes being arranged beside said light-permeable member;
   said light-permeable member has a light reflective film arranged therebelow; and
   said cover sheet member is so constructed that a portion thereof corresponding to said light emitting diodes permits only light emitted through said light-permeable member to permeate therethrough.

18. An equipment operation panel as defined in claim 17, wherein a plurality of said light emitting diodes are separated into two or more kinds different in luminous color from each other.

19. An equipment operation panel including an operation signal generation electric component for feeding an operation signal to a control unit arranged in an equipment and a light emitting element for displaying an operation state of the equipment and fixed on a casing of the equipment, comprising:

a first flexible circuit board including a main section formed thereon with a first circuit pattern which includes contacts of said operation signal generation electric component and said light emitting elements electrically connected to said first circuit pattern, and including a lead-out section arranged so as to extend from said main section and formed with a plurality of connection wire patterns connected to said first circuit pattern, said main section and lead-out section being arranged on a front surface of said first flexible circuit board and said light emitting element being fixed on said front surface of said first flexible circuit board;
   a spacer layer provided with a plurality of windows for receiving said contacts and light emitting element therein and laminated on said front surface of said first flexible circuit board;
   conductive members arranged in correspondence to said windows corresponding to said contacts of said spacer layer to generate said operation signal by contact with said contacts;
   a second flexible circuit board laminated on said spacer layer, provided at a portion thereof corresponding to said light emitting element with windows or constructed so that said portion exhibits light-permeability, and including a second circuit pattern which includes or is electrically connected to said conductive members;
   a cover sheet member laminated on said second flexible circuit board and formed so that at least a portion thereof corresponding to said conductive members exhibits flexibility and at least a portion thereof corresponding to said light emitting element exhibits light-permeability; and wherein said operation signal generation electric component comprises a variable resistor;

said variable resistor including:

said contacts constituted by a plurality of filament electrodes arranged on said front surface of said first flexible circuit board so as to be spaced from each other at predetermined intervals, a thin or thick resistive film formed on said front surface of said first flexible circuit board to electrically connect said plural filament electrodes to each other therethrough, and said conductive members incorporated in said second circuit pattern of said second flexible circuit board and positioned opposite to said plural filament electrodes;

said first circuit pattern and second circuit pattern are constructed so as to provide said operation signal proportional to a resistance value between at least one said filament electrode positioned at one end of said resistive film and said conductive members;

said main section of said first flexible circuit board, said spacer layer, said second flexible circuit board and said cover sheet member being laminated of each other in turn to provide a single laminate, said lead-out section of said first flexible circuit board being led out of said laminate in a manner to be insertable into said equipment.

20. An equipment operation panel including an operation signal generation electric component for feeding an operation signal to a control unit arranged in an equipment and a light emitting element for displaying an operation state of the equipment and fixed on a casing of the equipment, comprising:

a first flexible circuit board including a main section formed thereon with a first circuit pattern which includes contacts of said operation signal generation electric component and said light emitting elements electrically connected to said first circuit pattern, and including a lead-out section arranged so as to extend from said main section and formed with a plurality of connection wire patterns connected to said first circuit pattern, said main section and lead-out section being arranged on a front surface of said first flexible circuit board and said light emitting element being fixed on said front surface of said first flexible circuit board;

a spacer layer provided with a plurality of windows for receiving said contacts and light emitting element therein and laminated on said front surface of said first flexible circuit board;

conductive members arranged in correspondence to said windows corresponding to said contacts of said spacer layer to generate said operation signal by contact with said contacts;

a second flexible circuit board laminated on said spacer layer, provided at a portion thereof corresponding to said light emitting element with windows or constructed so that said portion exhibits light-permeability, and including a second circuit pattern which includes or is electrically connected to said conductive members;

a cover sheet member laminated on said second flexible circuit board and formed so that at least a portion thereof corresponding to said conductive members exhibits flexibility and at least a portion thereof corresponding to said light emitting element exhibits light-permeability; and wherein said operation signal generation electric component comprises a variable resistor; said variable resistor including:

said contacts constructed of a first filament electrode group including a plurality of filament electrodes arranged on said front surface of said first flexible circuit board so as to be spaced from each other at predetermined intervals and a second filament electrode group including a plurality of filament electrodes arranged in a manner to alternate with said plural filament electrodes of said first filament electrode group therebetween, to thereby be prevented from being contacted with said plural filament electrodes of said first filament electrode group and electrically connected to each other by means of a connection wire, a thin or thick resistive film formed on said front surface of said first flexible circuit board to electrically connect said plural filament electrodes of said first filament electrode group to each other therethrough, and said conductive member arranged opposite to said first and second filament electrode groups and incorporated in said second circuit pattern of said second flexible circuit board;

said first circuit pattern is constructed so as to provide said operation signal proportional to a resistance value between at least one said filament electrode positioned at one end of said first filament electrode group and said connection wire;

said main section of said first flexible circuit board, said spacer layer, said second flexible circuit board and said cover sheet member being laminated on each other in turn to provide a single laminate, said lead-out section of said first flexible circuit board being led out of said laminate in a manner to be insertable into said equipment.

21. An equipment operation panel as defined in claim 20, further comprising a plurality of dot-like insulating spacers arranged on at least one of said plural filament electrodes of said first and second filament electrode groups and a portion of said conductive member opposite to said plural filament electrodes in a manner to be spaced from each other at predetermined intervals in a longitudinal direction of said filament electrodes;

said insulating spacers being formed of an insulating paint by printing.

* * * * *